United States Patent
Kirsch et al.

(10) Patent No.: US 11,961,665 B2
(45) Date of Patent: Apr. 16, 2024

(54) METHOD AND DEVICE FOR CONTROLLING AN ARMATURE SOLENOID

(71) Applicant: BEHR-HELLA THERMOCONTROL GmbH, Stuttgart (DE)

(72) Inventors: Stefan Kirsch, Lippstadt (DE); Bastian Bandlow, Lippstadt (DE)

(73) Assignee: BEHR-HELLA THERMOCONTROL GmbH, Stuttgart (DE)

( * ) Notice: Subject to any disclaimer, the term of this patent is extended or adjusted under 35 U.S.C. 154(b) by 386 days.

(21) Appl. No.: 17/294,734

(22) PCT Filed: Nov. 21, 2019

(86) PCT No.: PCT/EP2019/082140
§ 371 (c)(1),
(2) Date: May 18, 2021

(87) PCT Pub. No.: WO2020/104614
PCT Pub. Date: May 28, 2020

(65) Prior Publication Data
US 2022/0020519 A1  Jan. 20, 2022

(30) Foreign Application Priority Data
Nov. 22, 2018 (DE) ...................... 10 2018 129 489.1

(51) Int. Cl.
*B60K 35/10* (2024.01)
*G01R 27/26* (2006.01)
(Continued)

(52) U.S. Cl.
CPC ........... *H01F 7/1844* (2013.01); *B60K 35/10* (2024.01); *G01R 27/2611* (2013.01); *B60K 35/25* (2024.01); *H01F 2007/185* (2013.01)

(58) Field of Classification Search
CPC .... H01F 7/16; H01F 7/1844; H01F 2007/185; H01F 2007/1855; G01R 27/2611;
(Continued)

(56) References Cited

U.S. PATENT DOCUMENTS

2017/0139405 A1*  5/2017  Bodenstein ............. G06F 3/016
2018/0090253 A1   3/2018  Songatikamas et al.

FOREIGN PATENT DOCUMENTS

EP   2966410 A1   1/2016
EP   3141871 A1   3/2017
(Continued)

OTHER PUBLICATIONS

International Search Report for corresponding Patent Application No. PCT/EP2019/082140 dated Feb. 6, 2020.

*Primary Examiner* — Danny Nguyen
(74) *Attorney, Agent, or Firm* — Christensen, Fonder, Dardi PLLC; Andrew H. Auderieth; Peter S. Dardi

(57) ABSTRACT

The invention relates to a device for controlling armature solenoid provided with a DC voltage source (14), at least one buffer capacitor (18), which is connected in parallel to the DC voltage source (14) and has a known capacitance (C), and a first switch (28), which is arranged between the DC voltage source (14) and the buffer capacitor (18). The exciter coil (16) and a second switch (30) arranged in series therewith are connected in parallel to the buffer capacitor (18). A control and evaluation unit (22), when the buffer capacitor (18) is charged, opens the first switch (28) and closes the second switch (30) in order to determine, on the basis of the measurement voltage (20), the frequency of the resonant circuit having the capacitance (C) of the buffer capacitor (18) and the inductance (L) of the armature solenoid (12). The inductance (L) of the armature solenoid (12) is determined on the basis of the frequency, and the air gap width (h) of the armature solenoid (12) is determined on the
(Continued)

basis of the inductance. The PWM control signal with which the armature solenoid (12) is operable in order to generate a predefined force to be applied by the armature solenoid (12) is applied to the second switch (30) on the basis of a look-up table or a mathematical modelling of the electromagnetic behavior of the armature solenoid (12).

5 Claims, 1 Drawing Sheet

(51) Int. Cl.
  *H01F 7/18* (2006.01)
  *B60K 35/25* (2024.01)
(58) Field of Classification Search
  CPC ... G01R 27/26; B60Y 2400/404; G06F 3/016; H03K 2217/96062; B60K 35/10; B60K 35/25
  USPC .......................................................... 361/160
  See application file for complete search history.

(56) References Cited

FOREIGN PATENT DOCUMENTS

| GB | 2256059 A | 11/1992 |
|---|---|---|
| JP | S58221173 A | 12/1983 |

\* cited by examiner

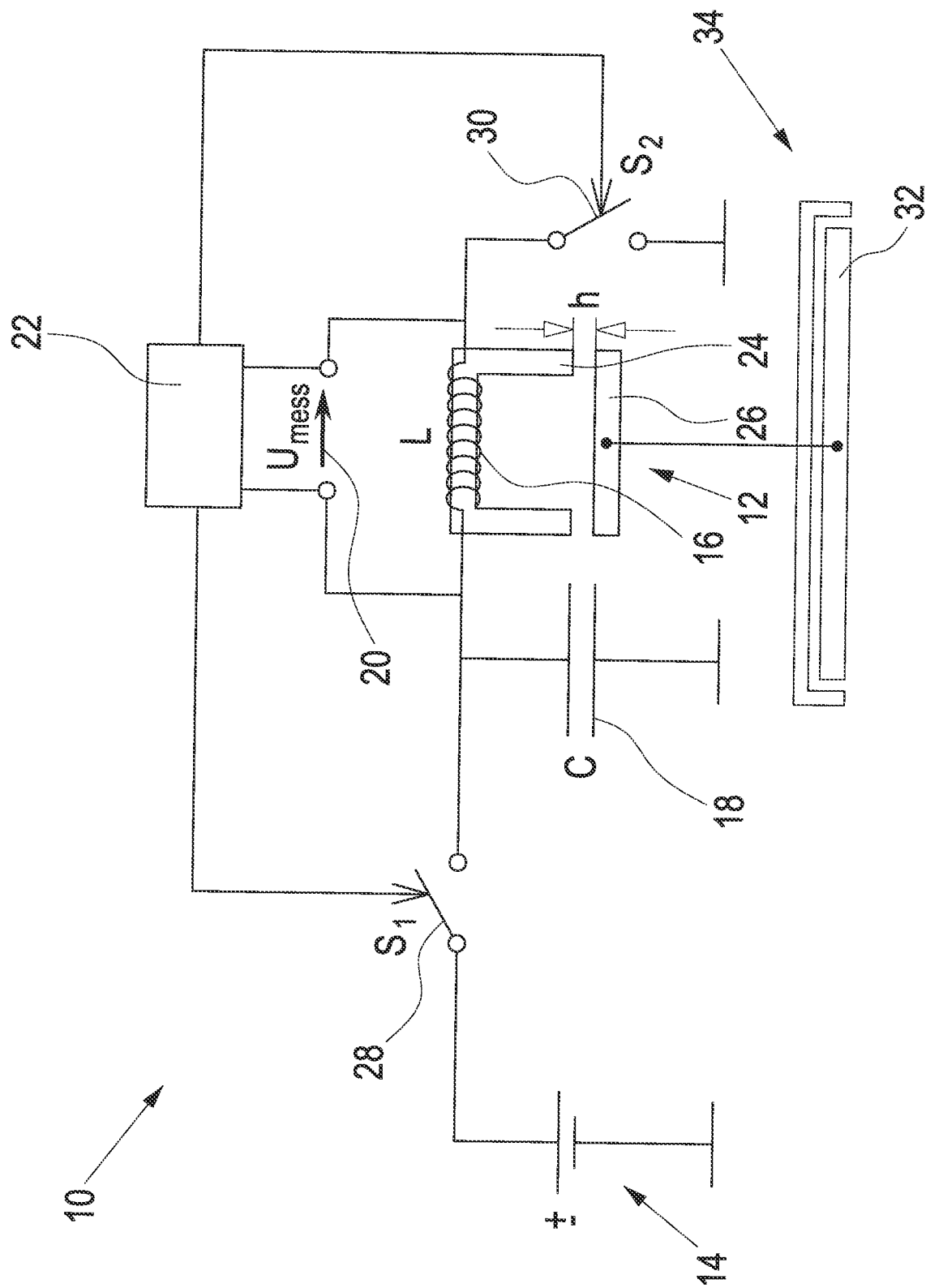

METHOD AND DEVICE FOR CONTROLLING AN ARMATURE SOLENOID

CROSS REFERENCE TO RELATED APPLICATIONS

This application is a National Stage filing of PCT Application No. PCT/EP2019/082140 filed Nov. 21, 2019, entitled "Method And Device For Controlling An Armature Solenoid", which claims priority of German Patent Application 10 2018 129 499.1 of Nov. 22, 2018, both of which are hereby incorporated into the subject matter of the present patent application by reference.

The invention relates to a method and a device for controlling an armature solenoid for generating a predefined force to be exerted by the armature solenoid for use in a vehicle operating unit with haptic feedback, which solenoid has a potentially changed air gap width in an idle state. In particular, the invention relates to such a device and such a method for use in operating units with haptic feedback for vehicles. Further, the invention relates to a vehicle operating unit with haptic feedback using the above-mentioned method and/or the above-mentioned device.

Armature solenoids are used for example in operating units with haptic feedback to mechanically excite a touch-sensitive operating element, such as a touch screen, in a pulse-like manner for a tactile feedback on a valid command input. Here, this pulse-like mechanic excitation should be as constant as possible over the service life of the operating unit.

Due to the influences of ageing and temperature, as well as for reasons related to manufacture, the air gap existing in the idle state of an armature solenoid is subject to tolerances in a range of up to several 100 μm. The size of the air gap, in good approximation, is inversely proportionate to the inductivity of the exciter coil of the armature solenoid or the inductivity of the armature solenoid, so that one and the same electric control signal applied to the exciter coil causes significantly different force curves.

In practice, armature solenoids are often controlled using a real-time control loop by means of which the influence of the air gap can be compensated for and be taking into account accordingly. An example for such a control system is described in WO-A-2017/046026. However, a control loop is sometimes ruled out for reasons of costs and resources (computing time, interrupts).

From U.S. Pat. No. 8,657,587 an infusion pump is known in which an armature solenoid causing the pumping effect is monitored with respect to its air gap.

US-A-2018/0090253 describes an operating unit using an armature solenoid whose air gap width is compensated for to control the pressing force applied on an operating element by a user.

It is an object of the invention to provide a method and a device for controlling an armature solenoid to generate a defined force to be applied by the armature solenoid, which method and device each operate without a sensor and without a control loop. Further, it is an object of the invention to provide an operating unit implementing a method mentioned above and a device mentioned above, respectively.

To achieve this object, the invention proposes a device for controlling an armature solenoid for generating a predefined force to be exerted by the armature solenoid for use in a vehicle operating unit with haptic feedback, which solenoid has a potentially changed air gap width in an idle state, wherein the device is provided with a DC voltage source for supplying an exciter coil of an armature solenoid, at least one buffer capacitor connected in parallel to the DC voltage source and having a known capacitance, a first switch arranged between the DC voltage source and the buffer capacitor, the exciter coil of the armature solenoid and a second switch arranged in series therewith being connected in parallel to the buffer capacitor, and a control and evaluation unit for controlling the first switch, as well as the second switch and for evaluating a measurement voltage dropping over the exciter coil, the control and evaluation unit, when the buffer capacitor is in a charged state, opening the first switch and closing the second switch and determining, from the measurement voltage, the frequency of the resonant circuit having the capacitance of the buffer capacitor and the inductance of the armature solenoid, the inductance of the armature solenoid being determinable by the control and evaluation unit based on the determined frequency, the air gap width of the armature solenoid being determinable by the control and evaluation unit based on the determined inductance of the armature solenoid, on the basis of a look-up table or a mathematical modelling of the electromagnetic behavior of the armature solenoid, the control and evaluation unit can apply to the second switch the PWM control signal with which, with consideration to the air gap width determined, the armature solenoid is operable to generate a predefined force to be applied by the armature solenoid.

Further, the invention provides a method for controlling an armature solenoid for generating a predefined force to be exerted by the armature solenoid for use in a vehicle operating unit with haptic feedback, which solenoid has a potentially changed air gap width in an idle state, the method comprising the following steps:

providing a look-up table or a mathematical modelling of the electromagnetic behavior of the armature solenoid, wherein it results from the look-up table or the mathematical modelling which PWM signal defined with respect to pulse width and/or duration is to be applied to an exciter coil of the armature solenoid for different assumed air gap widths in order to generate a predefinable force to be applied by the armature solenoid, and determining the air gap width of the armature solenoid by
operating the armature solenoid as a resonant circuit with a buffer capacitance connected in parallel to the exciter coil, determining the resonant circuit frequency from the voltage drop over the exciter coil, with the buffer capacitance being known, determining the inductance of the exciter coil based on the resonant circuit frequency and the known buffer capacitance, and determining the current air gap width based on the number of windings of the exciter coil and the cross sectional area of the air gap of the armature solenoid, and controlling the exciter coil by the PWM signal which is obtained based on the look-up table or the mathematical modelling, with the force to be exerted and the air gap width determined being given.

Eventually, the object is also achieved by using the above-mentioned device of the above-mentioned method to generate a haptic feedback in a vehicle operation unit.

Finally, in order to achieve the object, a vehicle operating unit with haptic feedback is proposed which is provided with an operating element which is manually operable, and a device of the type mentioned above, the armature solenoid of the device acting mechanically on the operating element and exciting the same in a pulse-like manner to generate a haptic feedback.

It is an essential feature of the invention to indirectly determine the inductance of the armature solenoid based on the measurement voltage which drops over the exciter coil of the armature solenoid when the armature solenoid, sometimes also referred to as pull-type solenoid, is operated with a buffer capacitance (buffer capacitor) as a resonant circuit. The frequency of the resonant circuit can be determined from the measurement voltage. With the buffer capacitance known, the inductance of the armature solenoid can then be determined. With the inductance known, the air gap which can then be calculated based on the known dependence of the inductance from the number of windings of the exciter coil, the size of the cross sectional area of the air gap, the width of the air gap and the permeability of the air. Using a look-up table or a mathematical modelling of the electromagnetic behavior of the armature solenoid, it is then possible to determine or read the amplitude and duration of the control signal with which the exciter coil is to be controlled for the armature solenoid to exert a desired force.

The physical-mathematical basics and facts in which the invention eventually underlying the invention are as follows.

The inductance of a sufficiently dimensioned armature solenoid having an air gap conforms, in good approximation, to the formula $$L = \frac{N^2 A \mu_0}{h}$$

Here, N is the number of windings of the coil, A is the cross-sectional area of the air gap, h is the length of the same and $\mu_0$ is the permeability of the air. While all other parameters are fixed relatively precisely and vary only insignificantly, the length of the air gap h is subject to greater tolerances and external influences.

It would now be obvious to measure the length of the air gap using suitable sensor systems and to compensate their influence on the inductance by controlling. As an alternative, concepts exist in which the magnetic flux in the core of the solenoid is measured using an additional measuring coil and controlling is performed based thereon (see e.g., WO 2017/046026 A1).

For a reduction of hardware resources required, the invention provides for an indirect measurement of the inductance of the assembly and to therefrom conclude on the air gap width according to the above formula. This should not be performed in the context of a control, but at a few times properly selected from an end user's point of view, e.g., after a substantial temperature change has occurred which gives reason to assume that the air gap has changed. In addition, an initial measurement should be carried out in any case when the apparatus is started.

According to the invention, the measurement is realized such that the coil of the armature solenoid is connected, via a switch, to a charged buffer capacitances C existing anyway. At the same time, the buffer capacitors are disconnected from the voltage source. If necessary, measures must be taken (e.g., connectable resistors) so that the current will not become so large that a significant air gap change occurs. Thus, an electric (RLC) resonant circuit is formed whose resonant frequency f is $$f = \frac{1}{2\pi}\sqrt{\frac{1}{LC}}.$$

Using a preferably high-impedance A/D converter, the voltage of the resonant circuit can be measured and be evaluated by software with regard to its frequency. In order to keep the required sampling rate and computing performance of the microcontroller of the control and evaluation unit limited, it is useful to select the capacitance C such that the frequency is low according to the formula indicated. For the inductance, given the capacitance known and the frequency measured, it follows from the measurement that $$L = \frac{1}{C(2\pi f)^2}$$

and eventually for the air gap width $$h = \frac{N^2 A \mu_0}{L}.$$

Based on the air gap width thus determined, suitable electric control signals can be determined from mathematical models or look-up tables, so as to generate a defined force profile without controlling.

The invention will be explained in detail hereinafter with reference to the drawing which illustrates a schematic circuit diagram.

The circuit 10 for controlling an armature solenoid 12 comprises a DC voltage source 14 for energizing the exciter coil 16 of the armature solenoid. A buffer capacitor 18 is connected in parallel with the DC voltage source 14. The measurement voltage 20 drops over the exciter coil 16, which voltage is evaluated by a control and evaluation unit 22. The control and evaluation unit 22 is a device comprising e.g., a microcontroller, an A/D converter and other components necessary for digital signal processing, as is known per se.

h designates the air gap width between the yoke 24 and the plunger 26 of the armature solenoid 12. The plunger 26 is mechanically coupled with an operating element of a vehicle operating unit, for example. The operating element has an operating surface which is touch-sensitive, for example. Upon a valid actuation of the operating element, the same is mechanically excited so as to provide a tactile feedback. To this end, in particular a semiconductor switch 28 is closed for a certain time by means of a control signal generated by the control and evaluation unit 22.

In order to supply the electric energy required for the desired generation of force to the exciter coil 16 by closing the switch 28, e.g., upon a temperature-related change of the air gap width h, it is necessary from time to time to determine the air gap width h. For this purpose, the switch 28 is opened and another switch, in particular a semiconductor switch 30 is closed which was open before. With the switch 30 closed, the measurement voltage 20 is evaluated in order to determine the frequency of the resonant circuit from the buffer capacitance C and the inductance L of the armature solenoid 12. With the buffer capacitance C known, it is possible to thereby determine the inductance L of the armature solenoid 12 and to calculate therefrom the air gap width h, with the winding number of the exciter coil 16 and the cross-sectional area A of the air gap being known. From a look-up table or by modelling the armature solenoid 12, it is then possible to determine the pulse duration for which the switch 28 has to be closed in order to generate the required or desired force by the armature solenoid 12 given the currently determined air gap width h.

The essential advantage of the circuit 10 or the device of the invention is that the armature solenoid can be controlled without a control loop and without a sensor, so as to apply the desired force. Thus, in contrast with known controls of armature solenoids of in particular operating elements with haptic feedback for a vehicle, no expensive and computing-intensive real-time control loop is needed, since the armature solenoid is controlled based on the indirect measurement of the air gap width.

In the drawing, the reference numeral 32 indicates an operating element of a vehicle operating unit 34, which is mechanically excited in a pulse-like manner by the armature solenoid 12 to generate a haptic feedback. The operating element 32 may be a touchscreen or a touchpad. When a valid actuation of the operating element 32 is detected, the armature solenoid 12 is controlled to tactilely signal the valid actuation to the user.

LIST OF REFERENCE NUMERALS

10 circuit
12 armature solenoid
14 DC voltage source
16 exciter coil
18 buffer capacitor
20 measurement voltage
22 control and evaluation circuit
24 yoke
26 plunger
28 semiconductor switch
30 semiconductor switch
32 operating element
34 operating element
A cross-sectional area
C buffer capacitance
L inductance
h air gap width

The invention claimed is:

1. A device for controlling an armature solenoid for generating a predefined force to be exerted by the armature solenoid for use in a vehicle operating unit with haptic feedback, which armature solenoid has a potentially changed air gap width in an idle state, the device comprising:
    a DC voltage source for exciting an exciter coil of an armature solenoid,
    at least one buffer capacitor connected in parallel to the DC voltage source and having a known capacitance,
    a first switch arranged between the DC voltage source and the buffer capacitor,
    the exciter coil of the armature solenoid and a second switch arranged in series therewith being connected in parallel to the buffer capacitor, and
    a control and evaluation unit for controlling the first switch, as well as the second switch and for evaluating a measurement voltage dropping over the exciter coil,
    wherein the control and evaluation unit, when the buffer capacitor is in a charged state, opening the first switch and closing the second switch and determining, from the measurement voltage, the frequency of the resonant circuit having the capacitance of the buffer capacitor and the inductance of the armature solenoid,
    the inductance of the armature solenoid being determinable by the control and evaluation unit based on the determined frequency,
    the air gap width of the armature solenoid being determinable by the control and evaluation unit based on the determined inductance of the armature solenoid, and
    based on a look-up table or a mathematical modelling of the electromagnetic behavior of the armature solenoid, the control and evaluation unit can apply to the second switch the PWM control signal with which, with consideration to the air gap width determined, the armature solenoid is operable to generate a predefined force to be applied by the armature solenoid.

2. A method for controlling an armature solenoid for generating a predefined force to be exerted by the armature solenoid for use in a vehicle operating unit with haptic feedback, which solenoid has a potentially changed air gap width in an idle state, the method comprising the following steps:
    providing a look-up table or a mathematical modelling of the electromagnetic behavior of the armature solenoid, wherein a result from the look-up table or the mathematical modelling which PWM signal defined with respect to pulse width and/or duration is to be applied to an exciter coil of the armature solenoid for different assumed air gap widths in order to generate a predefinable force to be applied by the armature solenoid, and
    determining the air gap width of the armature solenoid by operating the armature solenoid as a resonant circuit with a buffer capacitance connected in parallel to the exciter coil,
        determining the resonant circuit frequency from the voltage drop over the exciter coil, with the buffer capacitance being known,
        determining the inductance of the exciter coil based on the resonant circuit frequency and the known buffer capacitance, and
        determining the current air gap width based on the number of windings of the exciter coil and the cross sectional area of the air gap of the armature solenoid, and
    controlling the exciter coil by the PWM signal which is obtained based on the look-up table or the mathematical modelling, with the force to be exerted and the determined air gap width being given.

3. The use of the device of claim 1 for generating a haptic feedback in a vehicle operating unit.

4. A vehicle operating unit with haptic feedback, comprising:
    an operating element which is manually operable, and
    the device of claim 1,
    the armature solenoid of the device acting mechanically on the operating element and exciting the same in a pulse-like manner to generate a haptic feedback.

5. The use of the method of claim 2 for generating a haptic feedback in a vehicle operating unit.

\* \* \* \* \*